(12) United States Patent
Harris

(10) Patent No.: US 7,196,584 B2
(45) Date of Patent: Mar. 27, 2007

(54) AMPLIFIER CIRCUIT

(75) Inventor: Mark V. Harris, Farnborough (GB)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 10/432,802

(22) PCT Filed: Nov. 23, 2001

(86) PCT No.: PCT/GB01/05182

§ 371 (c)(1),
(2), (4) Date: Jan. 20, 2004

(87) PCT Pub. No.: WO02/43240

PCT Pub. Date: May 30, 2002

(65) Prior Publication Data

US 2004/0113695 A1    Jun. 17, 2004

(30) Foreign Application Priority Data

Nov. 24, 2000    (GB) ................................ 0028689.8

(51) Int. Cl.
*H03F 3/04* (2006.01)
(52) U.S. Cl. ..................................... 330/296; 330/297
(58) Field of Classification Search ................. 330/10, 330/85, 133, 285, 296, 297, 298
See application file for complete search history.

(56) References Cited

U.S. PATENT DOCUMENTS

| | | | |
|---|---|---|---|
| 5,642,378 A | | 6/1997 | Denheyer et al. |
| 5,710,523 A | * | 1/1998 | Kobayashi .................. 330/293 |
| 5,977,883 A | * | 11/1999 | Leonard et al. .............. 340/906 |
| 5,986,503 A | * | 11/1999 | Ichikawa ..................... 330/277 |
| 5,986,509 A | * | 11/1999 | Lohninger ................... 330/290 |
| 6,025,754 A | * | 2/2000 | Czora .......................... 330/296 |
| 6,043,707 A | * | 3/2000 | Budnik ........................ 330/10 |
| 6,081,161 A | * | 6/2000 | Dacus et al. ................. 330/297 |
| 6,148,220 A | * | 11/2000 | Sharp et al. ................. 455/572 |
| 6,169,455 B1 | * | 1/2001 | Yamaguchi .................. 330/279 |
| 6,605,999 B2 | * | 8/2003 | Matsushita et al. ......... 330/285 |
| 6,630,867 B2 | * | 10/2003 | Canyon et al. .............. 330/297 |
| 6,636,112 B1 | * | 10/2003 | McCune ....................... 330/10 |
| 6,794,935 B2 | * | 9/2004 | Klomsdorf et al. ......... 330/129 |
| 6,897,730 B2 | * | 5/2005 | Dupuis et al. ............... 330/297 |
| 2003/0155978 A1 | * | 8/2003 | Pehlke ........................ 330/296 |

FOREIGN PATENT DOCUMENTS

| | | |
|---|---|---|
| GB | 2 316 561 | 2/1998 |
| GB | 2 332 997 | 7/1999 |

* cited by examiner

*Primary Examiner*—Linh V. Nguyen
(74) *Attorney, Agent, or Firm*—Russell Ben Miller

(57) ABSTRACT

An amplifier circuit 11 comprises an amplifier 12, an indicator of desired power 15, a power control circuit 14 and a power measuring circuit 13. The amplifier 12 amplifies an input signal to produce an output signal, and has an input for controlling a supply current I and an input for receiving a supply voltage V and supply current I, for driving the amplifier. The power control circuit calculates and applies values of both a supply voltage V and a supply current I, according to any one of a plurality of desired power levels, in order to operate the amplifier with maximum efficiency over a wide range of power levels. The power control circuit may further comprise a power control loop whereby adjustment of the output power can also be effected according to a measurement of output power and a desired level of output power.

31 Claims, 11 Drawing Sheets

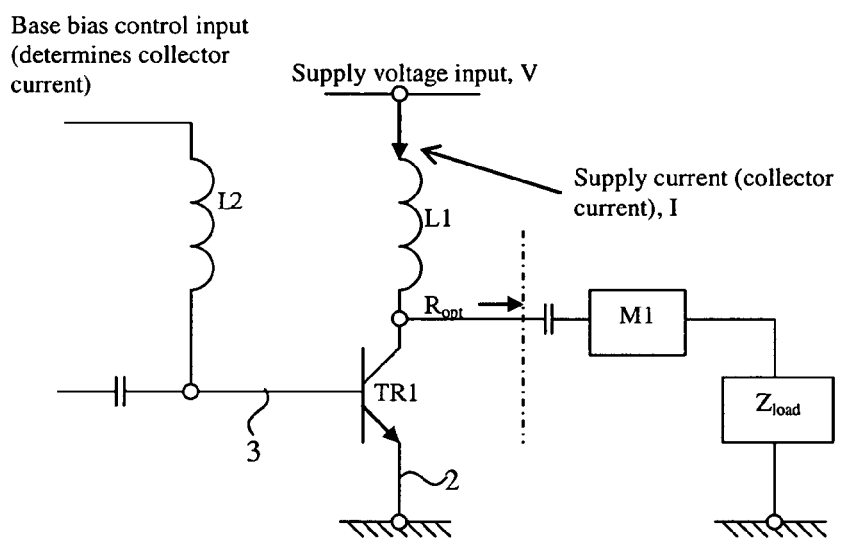
FIGURE 1

DC power = Vs*Is/2

AC power = (Vs*Is)/8  (Vsat→0)

Efficiency = 25%

DC power = Vs*Is

AC power = (Vs*Is)/2   (Vsat→0)

Efficiency = 50%

AC power = (Vs*Is)/2   (Vsat→0)

DC power = 2Vs*Is

Efficiency = 25%

AC power = (1.5Vs*1.5Is)    (Vsat→0)

DC power = (1.5Vs*1.5Is)/2

Efficiency = 50%

AC power = (0.75Vs*0.75Is)/2  (Vsat→0)

DC power = 0.75Vs*0.75Is

Efficiency = 50%

AMPLIFIER CIRCUIT

RELATED APPLICATIONS

This application is a 371 of PCT/GB01/05182 filed on Nov. 23, 2001.

The invention relates to an amplifier circuit and a method of operating an amplifier.

BACKGROUND OF THE INVENTION

Electronic amplifiers, and in particular power amplifiers, are widely used in audio equipment and in the transmitters of telecommunication transceivers. One of the requirements for such amplifiers is to obtain the best possible efficiency. For the purpose of this description, amplifier efficiency can be regarded as the ratio between alternating-current (AC) output power and direct-current (DC) input power supplied to the amplifier.

In known amplifiers, this requirement is addressed by first specifying the required output power level, and then optimising the amplifier for that specific output power level. One known way of optimising the amplifier is to select an optimum load for the required output power level. Another is to employ a switchable load that can be adjusted according to different required output power levels. Usually, the output power level, in the case of a single value of load, is specified to be either the highest operating level, or slightly below the highest operating level in order to minimise the effect of reduced efficiency, measured as lost dissipated power, at higher power levels for which dissipated loss is greatest.

However, a problem of this approach is that it is only possible, for a given load, to maintain near-optimum efficiency for the specified output power level for that load. If an amplifier optimised for a specified output power level is used for a different power level, then a significant reduction in efficiency results if the amplifier is not re-adjusted (e.g. by adjusting the load). For example, if a class-A amplifier with a fixed supply voltage is optimised for an output power level of P Watts, then the amplifier, when operated at that output power level P, will have an efficiency that approaches the ideal 50% (the theoretical maximum for a transistor saturation voltage $V_{sat}$ of zero). If the same class-A amplifier is operated at an output power level of P/2 Watts, then the theoretical best obtainable efficiency is 25%.

The invention aims to provide an amplifier whose efficiency can be optimised for a range of output power levels.

SUMMARY OF THE INVENTION

According to one aspect of the invention, there is provided an amplifier circuit comprising: an amplifier for amplifying an input signal to produce an output signal, the amplifier being supplied a supply voltage V and being biased by a bias current I; means for specifying a desired output power of the amplifier; means for calculating, in accordance with a transfer function, both the bias current I and the supply voltage V depending on the desired output power; means for measuring power in the signal output from the amplifier; and control means for adjusting, in accordance with the transfer function and the measured power, both the bias current I and supply voltage V in order to optimise amplifier efficiency.

According to another aspect of the invention, there is provided an amplifier circuit comprising: an amplifier for amplifying an input signal to produce an output signal, the amplifier having a current-control signal input for determining a supply current and an input for receiving both a supply voltage and supply current, for driving the amplifier; means for specifying a desired power level; and control means for calculating values of supply current I and supply voltage V in order to optimise amplifier efficiency at the specified power level, and for applying the corresponding current-control signal and a corresponding supply voltage to the respective inputs of the amplifier.

The control means may be operable to adjust the supply current I and the supply voltage V to maximise the amplifier efficiency in accordance with the variable desired output power level P, and to substantially maintain constant the amplifier efficiency over a range of amplifier output power levels P.

In practice, the amplifier circuit may comprise a transistor, and the control means may be operable to adjust the supply voltage V such that $$V = \sqrt{2RP} + V_{sat},$$

wherein R is a real impedance presented at an output of the transistor die, and $V_{sat}$ is the transistor saturation voltage. The supply current I is adjusted to $$I = \frac{V}{R}.$$

Thereby, the amplifier efficiency can be the same (i.e. near-ideal) for a wide range of output power levels. This is particularly advantageous for equipment that is required to operate at more than one output power level. This is achieved without requiring re-adjustment of the load impedance. In other words, a constant value of load impedance may be used for different output power levels without impairing the amplifier efficiency.

A typical application for the amplifier circuit would be for dynamic power control in a base station (terrestrial or satellite) of a telecommunications system, or indeed in a mobile terminal where efficiency is a key parameter and where the output signal power level can vary dynamically over time and over a wide range of levels.

Also, if a battery is used for supplying power to the amplifier, by adjusting the voltage V input to the amplifier, rather than supplying the amplifier direct from the battery, the amplifier's efficiency is independent of a change of charge in the battery, e.g. as a result of battery discharge. A DC-to-DC converter could be used to provide the variable supply voltage. DC-to-DC converters have relatively high efficiency.

Furthermore, by adjusting both the input supply voltage and the supply current, the levels of generated harmonics in the case of non-class-A operation can be controlled more easily. That is, a symmetrical waveform can be produced for a wide range of output power levels, with voltage limiting and current limiting occurring at both peaks and troughs of the signal waveform. This reduces the level of second harmonic generated.

According to a further aspect of the invention, there is provided a method of operating an amplifier for amplifying an input signal to produce an output signal, the method comprising:

specifying a desired output power of the amplifier; calculating, in accordance with a transfer function, both the bias current I and the supply voltage V depending on the desired output power; supplying the amplifier with the supply voltage V and the bias current I; and measuring power in the signal output from the amplifier; and adjusting, in accordance with the transfer function and the measured power, both the bias current I and supply voltage V in order to optimise amplifier efficiency.

The above and further features of the invention are set forth with particularity in the appended claims and together with advantages thereof will become clearer from consideration of the following detailed description of an exemplary embodiment of the invention given with reference to the accompanying drawings.

DETAILED DESCRIPTION OF AN
EMBODIMENT OF THE INVENTION

Figure 1:
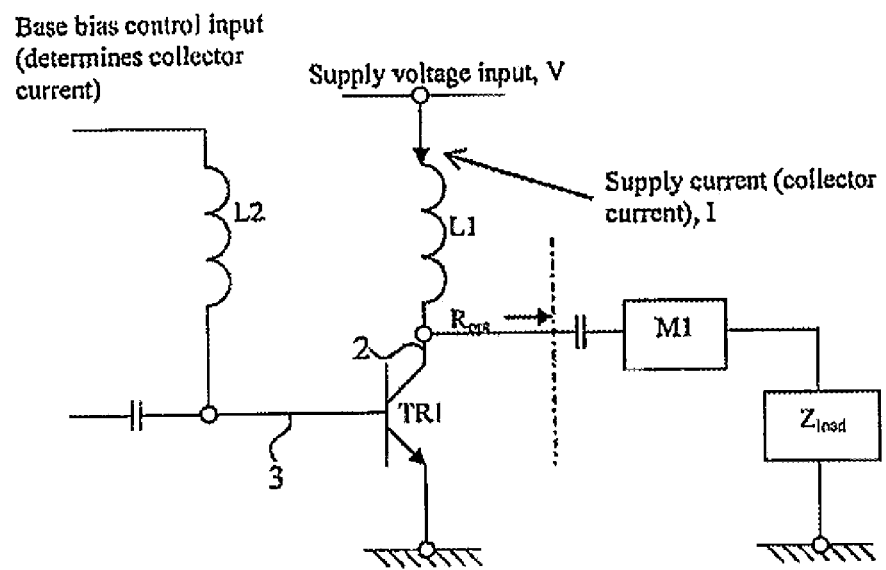
FIG. 1 illustrates a transistor amplifier circuit.

Referring to FIG. 1 of the accompanying drawings, there is shown an amplifier 1 comprising a NPN bipolar transistor TR1. An inductor L1 is connected to a collector terminal 2 of the transistor TR1. Likewise, an inductor L2 is connected to a base terminal 3 of the transistor TR1. A load $Z_{load}$ is connected to the collector terminal 2 via a lossless matching circuit M1. The lossless matching circuit transforms the load $Z_{load}$ into a completely real impedance $R_{opt}$. Accordingly, the effective load presented to the transistor collector is $R_{opt}$. Preferably, the matching circuit M1 includes any transistor parasitics (collector-emitter capacitance and load inductance) so that $R_{opt}$ is the impedance presented to the transistor die. $R_{opt}$ is called the dynamic load impedance and has the value of a pure resistance, measured in units of Ohms.

Figure 2:
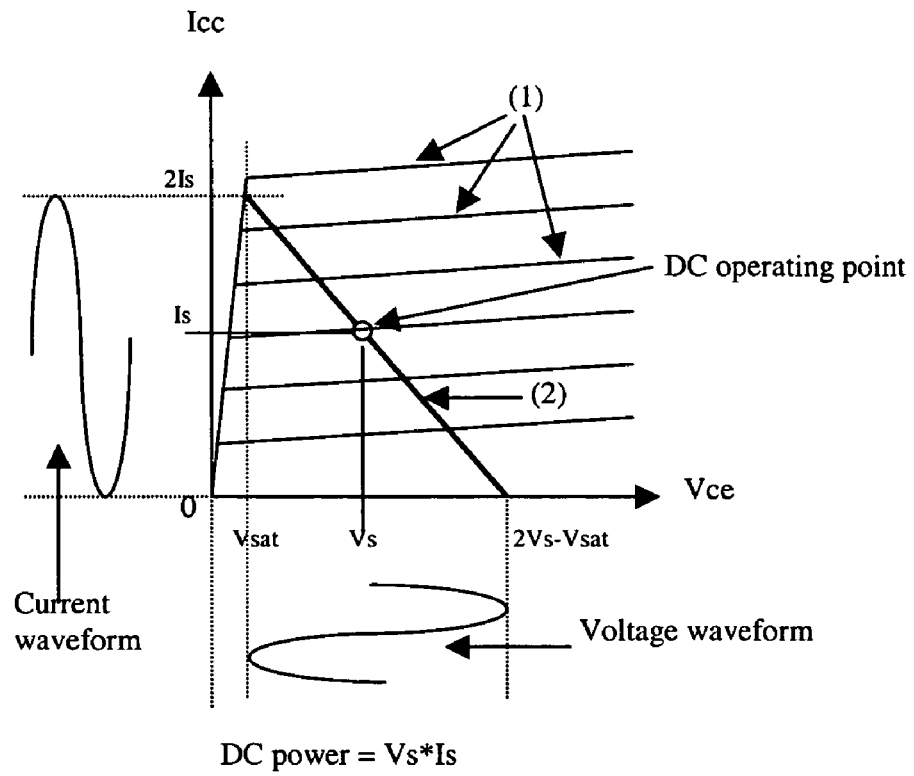
FIG. 2 illustrates collector characteristic curves and a dynamic load line of the transistor of FIG. 1.

Referring now to FIG. 2, there are shown the collector characteristic curves 1 of the transistor TR1 together with dynamic load line 2. The horizontal axis of the graph corresponds to the collector-emitter voltage $V_{ce}$. (If, in the alternative, a field-effect transistor (FET) was used instead of the NPN bipolar transistor TR1, $V_{ce}$ would correspond to the drain-source voltage $V_{ds}$ (with the source at zero volts)). The vertical axis of the graph corresponds to the collector current $I_{cc}$ (the equivalent for a FET would be the drain current $I_{dd}$). The multiple curves 1 correspond to different values of base current (corresponding to different values of gate voltage for a FET). The gradient of the dynamic load line 2 is equal to $-(1/R_{opt})$. $V_s$ designates a particular value of DC supply voltage on the collector, while $I_s$ designates a particular value of the DC collector supply current.

In FIG. 2, the collector AC voltage is a sine wave of amplitude $V_s$, and the collector AC current is a sine wave of amplitude $I_s$. For the transistor TR1 to demonstrate the characteristics of FIG. 2, it is biased to obtain maximum efficiency. The condition for maximum efficiency is represented by dynamic load line 2 and corresponds to a unique value of $R_{opt}$. That is, $R_{opt}$ is predetermined such that, as the output power level is increased from zero, eventually, when limiting starts to occur, both voltage and current limiting begin simultaneously.

The output power level is equal to $$P_{ac} = \frac{(V_{ce} - V_{sat})^2}{2R_{opt}}, \quad \text{(equation 1)}$$

where $P_{ac}$ is in units of Watts, $V_{ce}$ and $V_{sat}$ are in units of Volts, and $R_{opt}$ is in units of Ohms. In FIG. 2, $V_{ce}=V_s$. Thus $$P_{ac} = \frac{(V_s - V_{sat})^2}{2R_{opt}}. \quad \text{(equation 2)}$$

As $V_{sat}$ tends to zero, and the DC collector supply current $$P_{ac} \approx \frac{V_s^2}{R_{opt}} = \frac{V_s \cdot I_s}{2}. \quad \text{(equation 3)}$$

$P_{ac}$ tend to $$I_s = \frac{V_s}{R_{opt}},$$

Since the DC input power is $V_s \cdot I_s$, the resulting theoretical efficiency (as $V_{sat}$ approaches zero) is 50%.

Equation 2 can be used to calculate the optimum DC supply voltage $V_s$:

$$V_s = \sqrt{2R_{opt}P_{ac}} + V_{sat} \quad \text{(equation 4).}$$

From $V_s$, the required DC collector supply current, $I_{cc}$, can be calculated:

$$I_{cc} = \frac{V_s}{R_{opt}}. \quad \text{(equation 5)}$$

Figure 3:
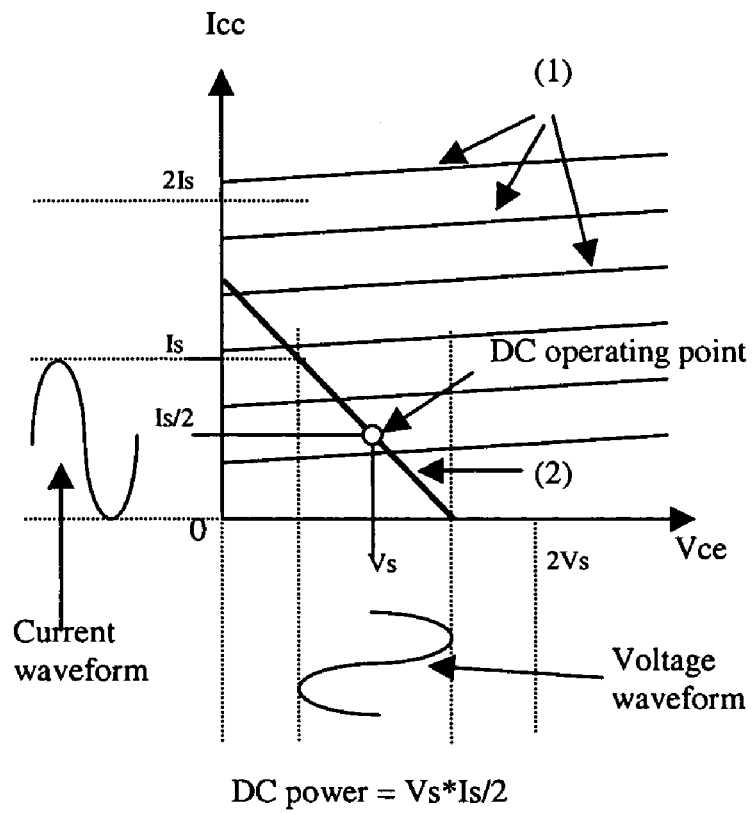
FIG. 3 illustrates idealised collector characteristic curves and a dynamic load line with a DC operating point at $V_s$ and $\frac{1}{2}I_s$.
Figure 4:
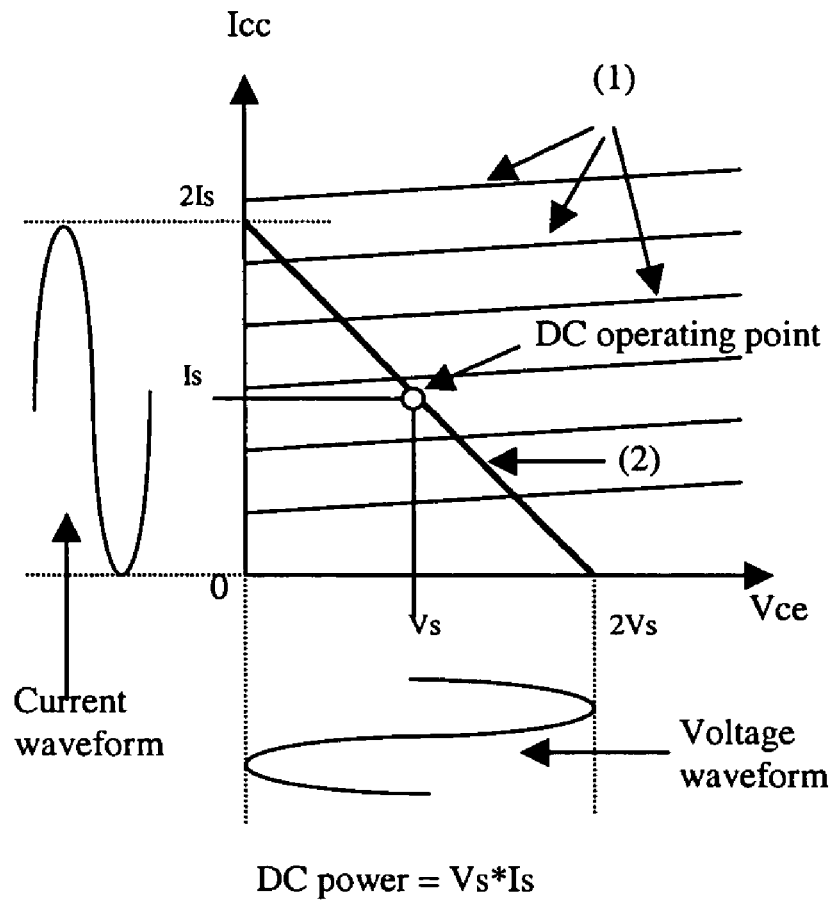
FIG. 4 illustrates idealised collector characteristic curves and a dynamic load line with a DC operating point at $V_s$ and $I_s$.
Figure 5:
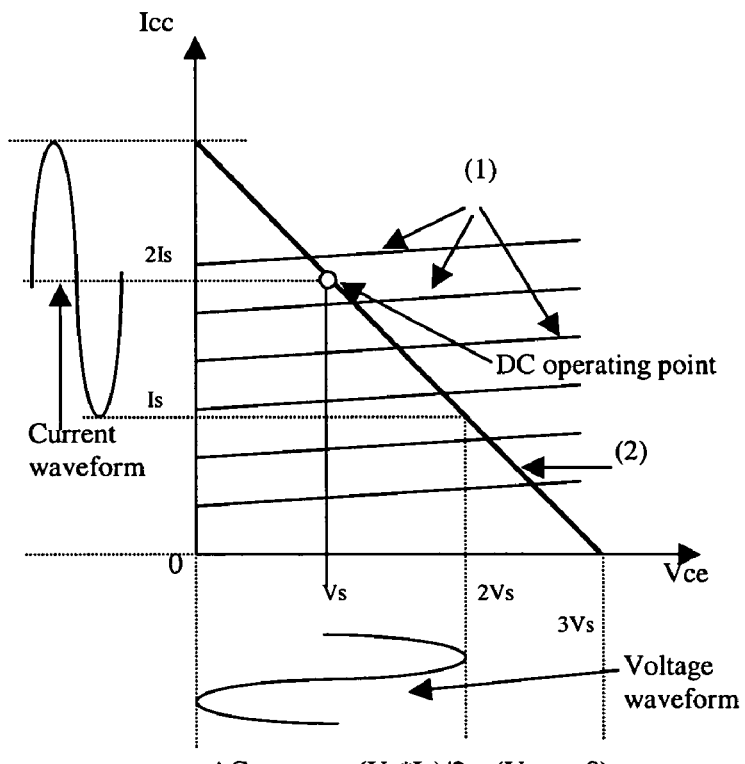
FIG. 5 illustrates idealised collector characteristic curves and a dynamic load line with a DC operating point at $V_s$ and $2I_s$.

FIGS. 3, 4 and 5 illustrate three graphs of collector characteristic curves 1 and dynamic load lines 2. In each of these graphs, $V_{ce}=V_s$ is a constant value, and the dynamic load line 2 gradient, derived from $R_{opt}$, is constant $$\left(-\frac{1}{R_{opt}}\right).$$

For each graph, the value of collector DC supply current $I_{cc}$ is different (a multiple or sub-multiple of $I_s$). For simplification, the characteristic curves have been approximated such that $V_{sat}$ is zero. The locus of collector voltage $V_{ce}$ and the collector current $I_{cc}$ is the dynamic load line 2.

FIG. 3 illustrates idealised collector characteristic curves 1 and a dynamic load line 2 with a DC operating point at $V_s$ and ½$I_s$, where $V_s$ and $I_s$ are constants. In FIG. 3, $$I_{cc} = \frac{I_s}{2}.$$

For the limiting case where the signal is maximum for linear operation (where limiting is just about to occur), the efficiency is 25%.

FIG. 4 illustrates idealised collector characteristic curves 1 and a dynamic load line 2 with a DC operating point at $V_s$ and $I_s$. In FIG. 4, $I_{cc}=I_s$ to bias the transistor to obtain maximum efficiency. The collector AC voltage is a sine wave of amplitude $V_s$ and the collector current is a sine wave of amplitude $I_s$. This corresponds to the conditions of FIG. 2, subject to $V_{sat}$ being assumed zero. In this condition, the amplifier is on the threshold limit of saturation, where the maximum voltage and current swing are obtained whilst maintaining linear (class A) operation with no limiting of either voltage or current. Thus, the theoretical efficiency is 50%.

FIG. 5 illustrates collector characteristic curves 1 and a dynamic load line 2 with a DC operating point at $V_s$ and $2I_s$. In FIG. 5, $I_{cc}=2I_s$. It can be seen that, as the signal amplitude is increased from zero, voltage limiting will occur first on the voltage minima, but not on the voltage maxima, giving rise to a high level of second harmonic relative to the fundamental. If, for the supply current of FIG. 5, the amplifier is operated at maximum power level whilst maintaining linear (class A) operation (as shown), then the efficiency is 25%.

Figure 6:
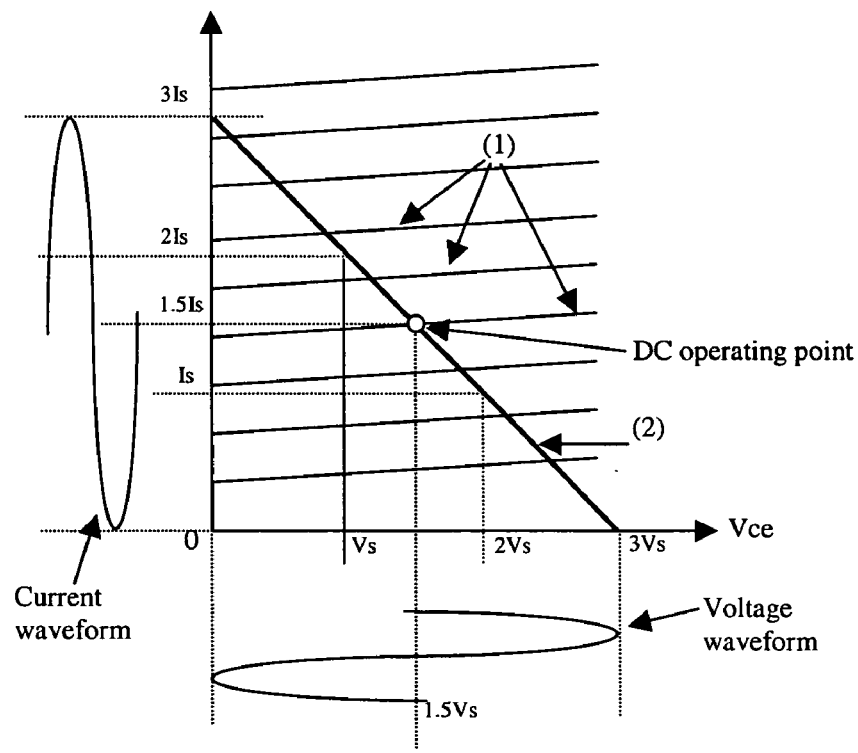
FIG. 6 illustrates idealised collector characteristic curves and a dynamic load line with a DC operating point at $1.5V_s$ and $1.5I_s$.
Figure 7:
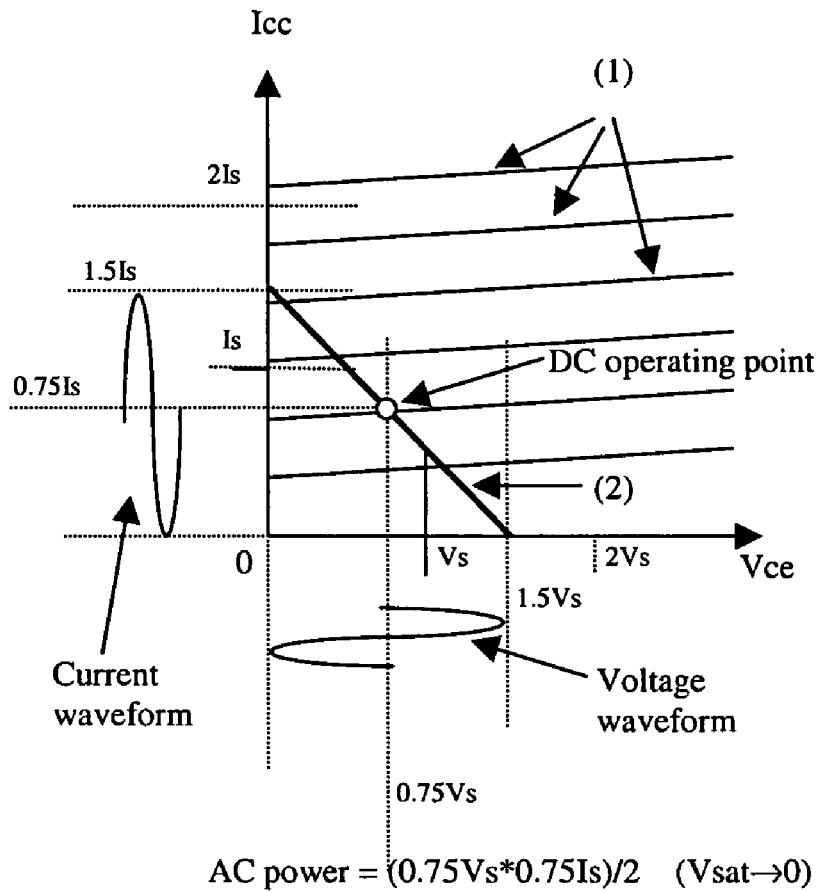
FIG. 7 illustrates idealised collector characteristic curves and a dynamic load line with a DC operating point at $0.75V_s$ and $0.75I_s$.

FIGS. 6 and 7 illustrate two examples where both the supply voltage and the supply current $I_{cc}$ are adjusted simultaneously to give a theoretic efficiency of 50% for each of two different power levels. FIG. 6 illustrates collector characteristic curves 1 and a dynamic load line 2 with a DC operating point at 1.5$V_s$ and 1.5$I_s$. FIG. 7 illustrates collector characteristic curves 1 and a dynamic load 2 line with a DC operating point at 0.75$V_s$ and 0.75$I_s$.

Figure 9:
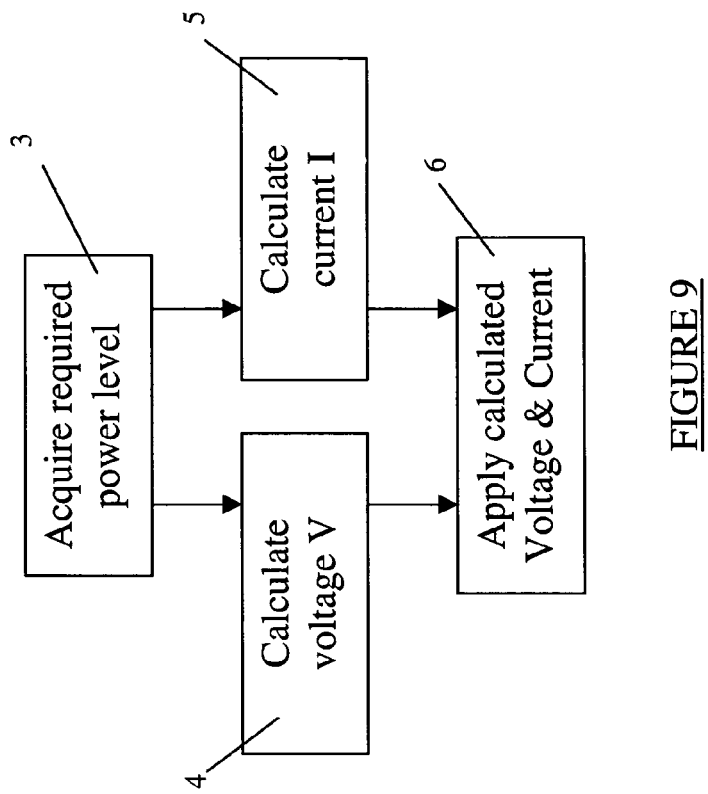
FIG. 9 is a flow diagram of another method of optimising the efficiency of an amplifier.
Figure 8:
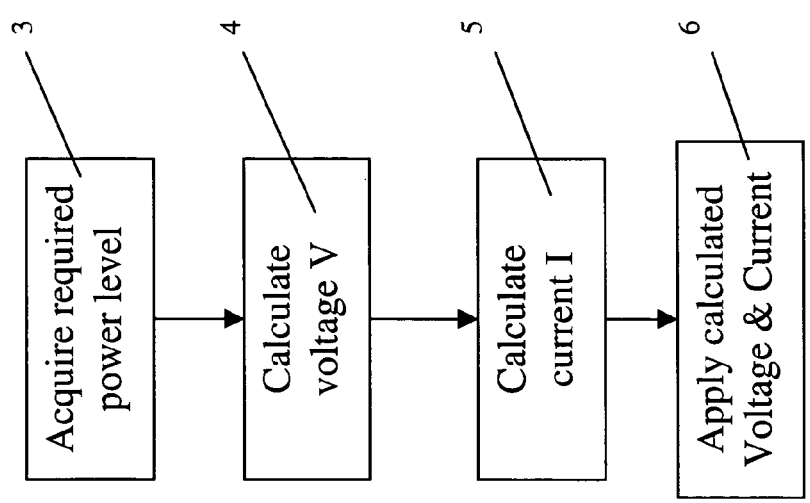
FIG. 8 is a flow diagram of one method of optimising the efficiency of an amplifier.

FIGS. 8 and 9 illustrate slightly different ways in which the amplifier may be controlled. FIG. 8 is a flow diagram of one method of optimising the efficiency of an amplifier. In FIG. 8 a required level of the power in the output from the amplifier is accepted at stage 3. Next, at stage 4, a value for the supply voltage V is calculated followed by a calculation 5 of the current I. The calculated voltage and current are then applied 6 to the amplifier to optimise its efficiency. FIG. 9 is a flow diagram of another method of optimising the efficiency of an amplifier. In FIG. 9 the same operations are performed, but the voltage and current calculations of stages 4 and 5 are calculated simultaneously or non-sequentially.

Figure 10:
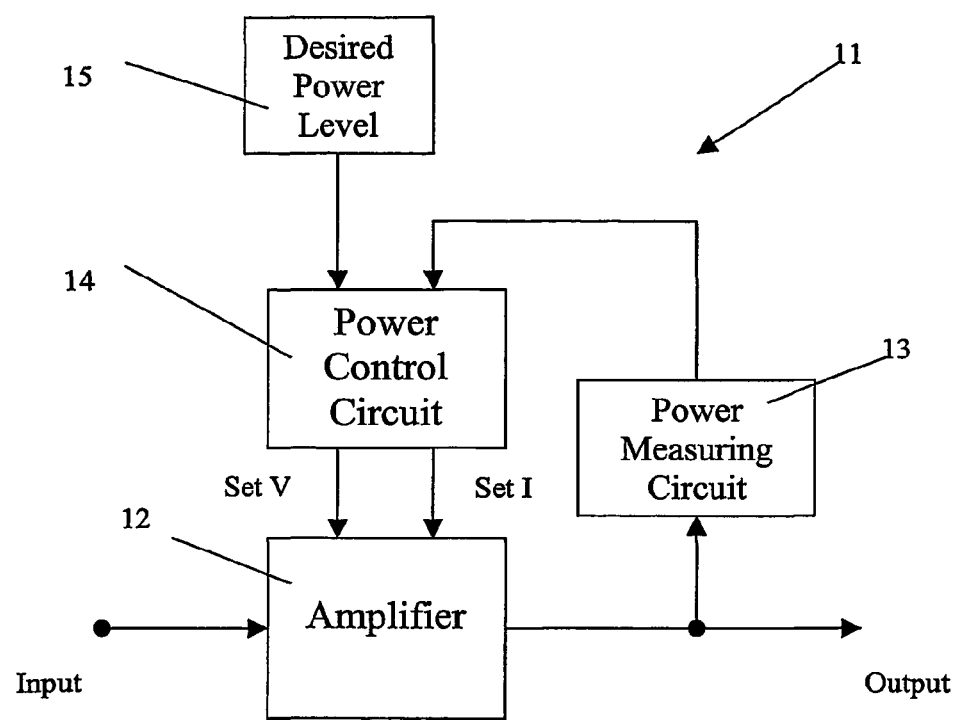
FIG. 10 is an outline block diagram showing the overall function of the amplifier circuit.

FIG. 10 of the accompanying drawings is a schematic circuit diagram of an amplifier circuit 11 with supply current and supply voltage control. The amplifier circuit 11 comprises an amplifier 12, which may for example comprise the amplifier of FIG. 1. The amplifier 12 has a current-control signal input ($I_{control}$) for determining a supply current I and an input for receiving both a supply voltage V and supply current I, for driving the amplifier. The $I_{control}$ signal operates, in the case of a bipolar transistor amplifier, to adjust the base bias current of the transistor, and this in turn acts to adjust the supply current (collector current). In the case of a FET amplifier, the $I_{control}$ signal operates to adjust the gate voltage of the transistor, which in turn acts to adjust the supply current (drain current).

The amplifier 12 receives a signal on an input line and outputs an amplified version of the received signal on an output line. A power measuring circuit 13, which may be an envelope detector for example, is connected to the output line and measures power in the signal thereon. It will be appreciated that a power measuring circuit 13 could instead be placed in series with the output line, but would nevertheless perform the same power measuring function.

A signal representing power is supplied from the power measuring circuit 13 to a power control circuit 14. The power control circuit 14 also receives a desired power level signal from a desired power level indicator 15. In an audio amplifier circuit, the desired power level indicator could be a variable resistor connected to a volume control knob for selection by a user. In cellular phone systems power control is used to control the power output by a cellular telephone. The power control essentially comes from one or both of two sources, namely from the cellular telephone itself or from the cellular system. In the former case power control is effected by measuring power in communication signals received by the cellular telephone and adjusting the output power in inverse proportion thereto. In the latter case power control is effected in the form of command signals from a mobile controller in the cellular system, which controller measures power in signals received from the cellular telephone and sends command to the cellular telephone to adjust its output power in order to meet desired parameters within the system. Thus, in an amplifier for a cellular telephone, the desired power level indicator could be a register that receives data from a source internal or external to the cellular telephone.

The power control circuit 14 uses that the desired power level signal to calculate and generate the above discussed supply voltage V and supply current I. The power control circuit 14 also uses the desired power level signal (from desired power level indicator 15) together with the output power signal from the power measuring circuit 13 to further adjust the value of V or I to accurately achieve the desired output power.

In general terms, efficiency is controlled by adjusting both supply voltage and supply current according to a desired power level, using a transfer function. The transfer function may be realised using a circuit which applies the above-discussed equations or one or more look up tables comprising empirically determined relationships between power levels, supply currents and supply voltages. Either way, the values of supply current I and supply voltage V necessary to achieve optimum amplifier efficiency for the desired/required power output are determined by the power control circuit 14. The power control circuit 14 then adjusts the supply current I and supply voltage V accordingly.

Figure 11:
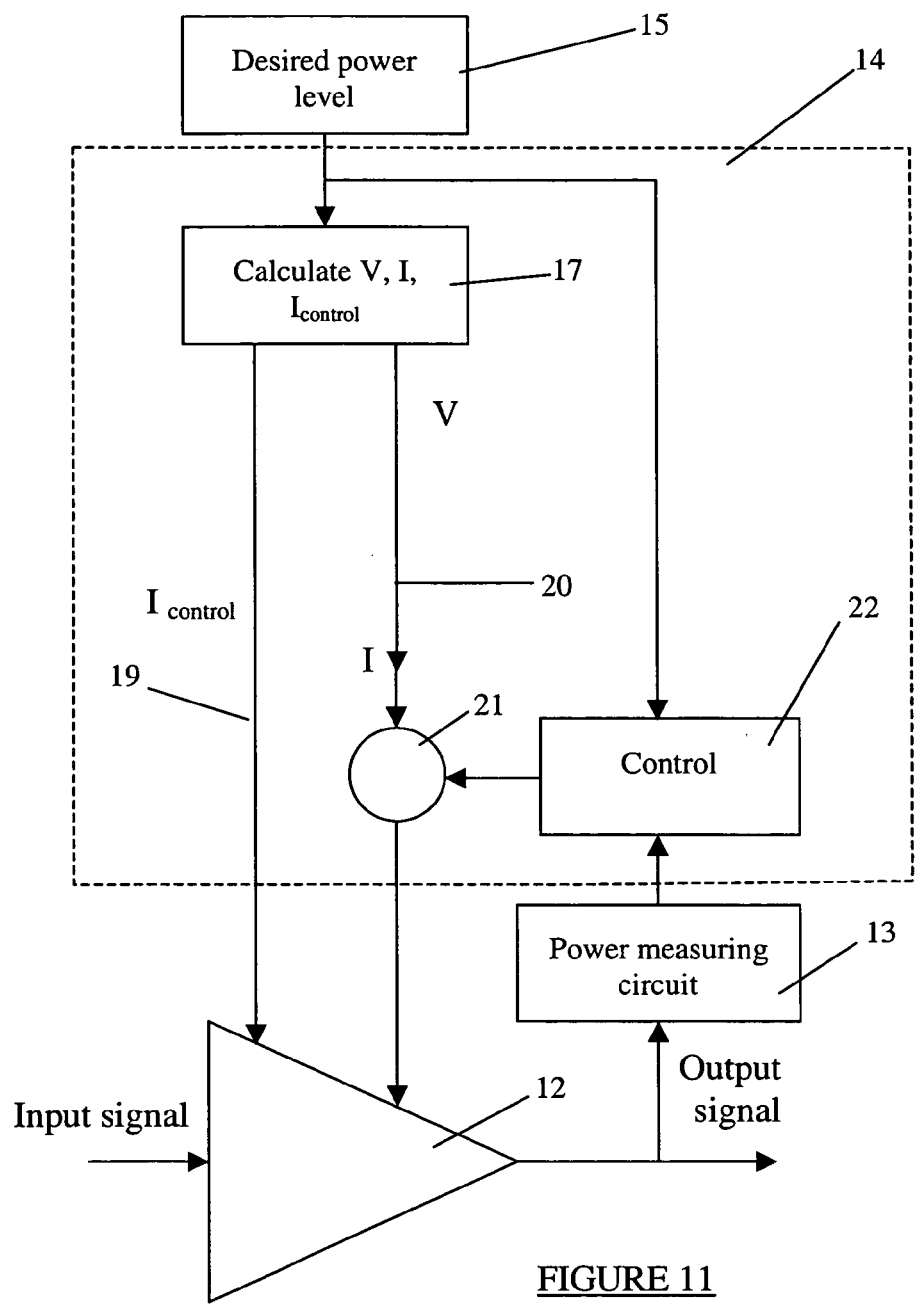
FIG. 11 is a more detailed block diagram of the amplifier circuit.

FIG. 11 is a more detailed block diagram of the amplifier circuit, and shows how efficiency and power are controlled independently. Power control is achieved by adjusting the supply voltage in accordance with measured output power.

The required power level is input to a calculating unit 17 in the power control circuit 14, which calculates values for V, I, and the corresponding value of $I_{control}$. $I_{control}$ at the calculated value is input to the amplifier 12 at line 19. In this way the efficiency of the amplifier is controlled.

The supply voltage V at the calculated value is output on line 20 to a summing circuit 21. The output from the power measuring circuit 13, i.e. a signal representing actual power, is input to a control unit 22, which also receives the required power level signal from the desired power level register 15. The control unit 22 serves as a comparator that provides a signal proportional to the difference between the required power level signal and the signal representing actual power.

The output of the control unit 22 is also input to the summing circuit 21, which thus adjusts the supply voltage V applied to the amplifier 12 depending on the difference between the desired power and the actual power. The summing circuit 21, the control function 22, the amplifier 12 and the power measuring circuit 13 thus form elements of a control loop to control the output power of the amplifier 12 as a separate parameter, independent of the controlling of efficiency.

Figure 12:
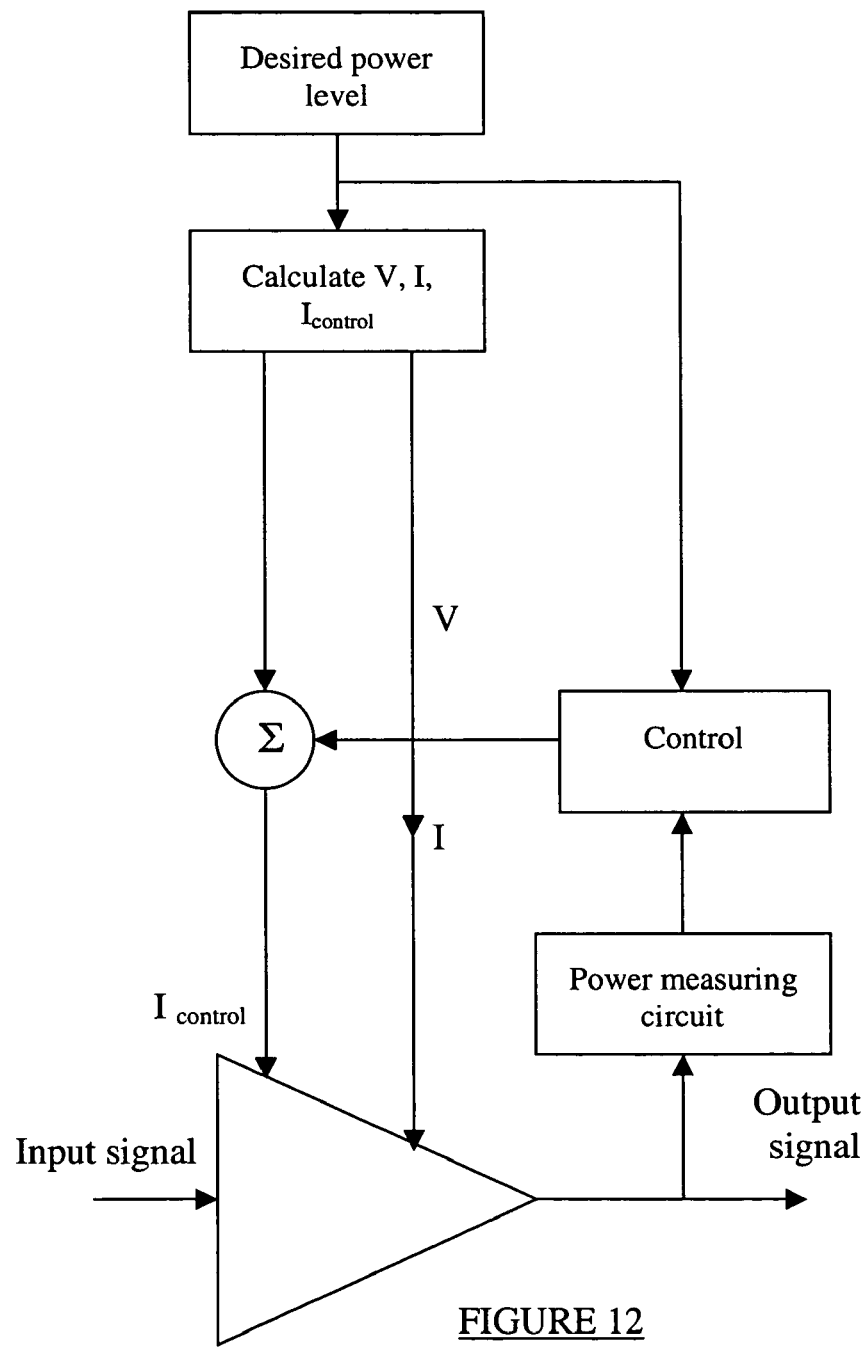
FIG. 12 is another detailed block diagram of the amplifier circuit.

FIG. 12 is another detailed block diagram of the amplifier circuit, showing an alternative arrangement in which power control is achieved by adjusting the supply current in accordance with measured output power. The arrangement in FIG. 12 is similar to that shown in FIG. 11, except that the output power is controlled by adjusting the supply current, as opposed to the supply voltage.

In an alternative arrangement (not shown) the power control circuit 14 additionally or alternatively controls the supply voltage and current of the amplifier circuit 11 in order to optimise the efficiency of the amplifier 12, based on the input power to the amplifier 12 and the gain of the amplifier 12. In this arrangement the power measuring circuit 13 would take measurements of the input signal and then adjust the supply voltage and current of the amplifier accordingly 12. A value could be assumed for the gain of the amplifier 12 based upon knowledge of the characteristics of the amplifier 12. Alternatively, the gain could be measured by using a second power measuring circuit to measure the output power. Independent accurate power control could be implemented as shown in FIG. 11 or FIG. 12.

Having thus described the invention by reference to a preferred embodiment it is to be well understood that the embodiment in question is exemplary only and that modifications and variations such as will occur to those possessed of appropriate knowledge and skills may be made without departure from the spirit and scope of the invention as set forth in the appended claims and equivalents thereof.

The invention claimed is:

1. An amplifier circuit comprising:
    an amplifier for amplifying an input signal to produce an output signal, the amplifier being supplied a supply voltage V and being biased by a bias current I;
    means for specifying a desired output power of the amplifier;
    means for calculating, in accordance with a transfer function, both the bias current I and the supply voltage V depending on the desired output power;
    means for measuring power in the signal output from the amplifier; and
    control means for adjusting, in accordance with the transfer function and the measured power, both the bias current I and supply voltage V in order to optimise amplifier efficiency.

2. An amplifier circuit as claimed in claim 1, wherein in use the output signal is output to a load impedance, and the transfer function serves to calculate values for both the bias current I and supply voltage V depending on the load impedance.

3. An amplifier circuit as claimed in claim 1, wherein the control means comprises a look up table and the transfer function is calculated by way of the look up table.

4. An amplifier circuit as claimed in claim 1, wherein the control means is operable to adjust the bias current I and supply voltage V to maintain substantially constant the amplifier efficiency over a range of amplifier output power levels P.

5. An amplifier circuit as claimed in claim 4, wherein the amplifier output power level P is an AC output power level.

6. An amplifier circuit as claimed in claim 5, wherein the amplifier comprises a transistor, and wherein a real impedance R is presented to an output of the transistor die.

7. An amplifier circuit as claimed in claim 6, wherein the control means is operable to adjust the supply voltage V such that $$V = \sqrt{2R \cdot P} + V_{sat},$$

wherein $V_{sat}$ is the transistor saturation voltage.

8. An amplifier circuit as claimed in claim 7, wherein the control means is operable to adjust the bias current I such that $$I = \frac{V}{R}.$$

9. An amplifier circuit as claimed in claim 7, wherein the control means is operable to adjust the bias current I such that $$I = \sqrt{2(P/R)}.$$

10. An amplifier circuit as claimed in claim 7, wherein the control means is operable to adjust the bias current I such that $$I = (\sqrt{2(P/R)} + V_{sat})/R.$$

11. An amplifier circuit as claimed in claim 6, wherein the transistor is a bipolar transistor, and the bias current I is the collector current of the bipolar transistor.

12. An amplifier circuit as claimed in claim 6, wherein the transistor is a field-effect transistor, and the bias current I is the drain current of the field-effect transistor.

13. An amplifier circuit as claimed in claim 6, wherein the load R is predetermined such that when limiting starts to occur on an increase of the amplifier output power level P, both voltage and current limiting start substantially simultaneously.

14. An amplifier circuit as claimed in claim 1, wherein the control means is operable to adjust the bias current I and the supply voltage V simultaneously.

15. A mobile terminal for a telecommunications system, the mobile terminal comprising an amplifier circuit as claimed in claim 1.

16. A base station for a telecommunications system, the base station comprising the amplifier of claim 14.

17. A telecommunications system comprising one or more mobile terminals according to claim 16, and one or more base stations according to claim 16.

18. The telecommunications system of claim 17, wherein the telecommunications system is a CDMA-based system.

19. A method of operating an amplifier for amplifying an input signal to produce an output signal, the method comprising: specifying a desired output power of the amplifier;
calculating, in accordance with a transfer function, both the bias current I and the supply voltage V depending on the desired output power;
supplying the amplifier with the supply voltage V and the bias current I;
measuring power in the signal output from the amplifier; and
adjusting, in accordance with the transfer function and the measured power, both the bias current I and supply voltage V in order to optimise amplifier efficiency.

20. A method as claimed in claim 19, further comprising outputting an the output signal from the amplifier to a load impedance, and calculating values for both the bias current I and supply voltage V depending on the load impedance.

21. A method as claimed in claim 19, further comprising using a look up table to calculate the transfer function.

22. A method as claimed in claim 19, further comprising adjusting the bias current I and supply voltage V to maintain substantially constant the amplifier efficiency over a range of amplifier output power levels P.

23. A method as claimed in claim 22, wherein the amplifier output power level P is an AC output power level.

24. A method as claimed in claim 23, wherein the bias current I and the supply voltage V are supplied to a transistor of the amplifier, and the supply voltage V is adjusted such that $$V = \sqrt{2R \cdot P} + V_{sat},$$

wherein $V_{sat}$ is the transistor saturation voltage.

25. A method as claimed in claim 24, wherein the bias current I is adjusted such that $$I = \frac{V}{R}.$$

26. A method as claimed in claim 24, wherein the bias current I is adjusted such that $$I = \sqrt{2(P/R)}.$$

27. A method as claimed in claim 24, wherein the bias current I is adjusted such that $$I = (\sqrt{2(P/R)} + V_{sat})/R.$$

28. A method as claimed in claim 24, wherein the transistor is a bipolar transistor, and the bias current I is the collector current of the bipolar transistor.

29. A method as claimed in claim 24, wherein the transistor is a field-effect transistor, and the bias current I is the drain current of the field-effect transistor.

30. A method as claimed in claim 24, further comprising predetermining the load R, and, on an increase of the amplifier output power level P, limiting substantially simultaneously both voltage and current.

31. A method as claimed in claim 19, further comprising adjusting the bias current I and the supply voltage V substantially simultaneously.

* * * * *

UNITED STATES PATENT AND TRADEMARK OFFICE
CERTIFICATE OF CORRECTION

PATENT NO. : 7,196,584 B2
APPLICATION NO. : 10/432802
DATED : March 27, 2007
INVENTOR(S) : Mark V. Harris It is certified that error appears in the above-identified patent and that said Letters Patent is hereby corrected as shown below:

On the Title Page

Delete Drawing sheet 1 and substitute therefor the Drawing sheet, consisting of fig 1 as shown on the attached page.

Signed and Sealed this

Eleventh Day of September, 2007

JON W. DUDAS
*Director of the United States Patent and Trademark Office*